United States Patent
Heo et al.

(10) Patent No.: US 7,409,257 B2
(45) Date of Patent: Aug. 5, 2008

(54) SYSTEM AND METHOD FOR MOVING SUBSTRATES IN AND OUT OF A MANUFACTURING PROCESS

(75) Inventors: Min-Young Heo, Chungcheongnam-do (KR); Sung-Joon Byun, Chungcheongnam-do (KR); Jung-Teak Lim, Chungcheongnam-do (KR); Byung-Kwen Park, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 319 days.

(21) Appl. No.: 10/871,007

(22) Filed: Jun. 21, 2004

(65) Prior Publication Data

US 2004/0228707 A1  Nov. 18, 2004

Related U.S. Application Data

(63) Continuation of application No. 09/480,689, filed on Jan. 11, 2000, now abandoned.

(30) Foreign Application Priority Data

Feb. 12, 1999 (KR) .................................. 99-4979

(51) Int. Cl.
   *G06F 19/00* (2006.01)
   *B65H 1/00* (2006.01)
(52) U.S. Cl. ................ 700/101; 700/104; 414/940; 414/805
(58) Field of Classification Search ............... 700/101, 700/104; 414/940, 805
See application file for complete search history.

(56) References Cited

U.S. PATENT DOCUMENTS 5,570,990 A   11/1996  Bonora et al. ............... 414/543
6,238,160 B1   5/2001  Hwang et al. ............... 414/217
6,398,476 B1   6/2002  Ando ........................... 414/282

FOREIGN PATENT DOCUMENTS

CN         348158      12/1998

OTHER PUBLICATIONS

"Flexible Manufacturing System Design and Practice" published by Chuan-Hua Book Store in Sep. 1988, pp. 219-220 (incl. partial translation), English Abstract Only.

*Primary Examiner*—Howard Weiss
*Assistant Examiner*—Steven H Rao
(74) *Attorney, Agent, or Firm*—F. Chau & Associates, LLC

(57) ABSTRACT

Disclosed is a system for moving substrates in and out of a manufacturing process. The present invention comprises an automatic transfer device for automatically transferring a cassette that stores substrates, a manual transfer device for transferring the cassette according to instructions of an operator, and a process apparatus for performing predetermined jobs on the substrate stored in the cassette, wherein the process apparatus comprises: a port on which the cassette is temporarily placed by the automatic transfer device or the manual transfer device; a loader which has a sensor to receive a communication start signal transferred from the automatic transfer device when the cassette is transferred by the automatic transfer device; and a job table on which actual jobs on the substrates, stored in the cassette, are performed, and wherein when the cassette is placed on the port, the process apparatus checks whether the communication start signal is received by the sensor, and when the signal is received, it is determined that the cassette has been transferred by the automatic transfer device, such that the process apparatus is set in an automatic transfer mode, and when the signal is not received, it is determined that the cassette has been transferred by the manual transfer device, and therefore, the process apparatus is set in a manual transfer mode. The present invention improves productivity and efficiency.

6 Claims, 3 Drawing Sheets ial transfer device for
SYSTEM AND METHOD FOR MOVING SUBSTRATES IN AND OUT OF A MANUFACTURING PROCESS This application is a continuation application of Applicants' U.S. patent application Ser. No. 09/480,689 filed on Jan. 11, 2000, now abandoned.

BACKGROUND OF THE INVENTION (a) Field of the Invention

The present invention relates to a system and a method for moving workpieces in and out of a manufacturing process. More specifically, the present invention relates to a system and a method for moving workpieces in and out of a manufacturing process for a semiconductor or a thin film transistor liquid crystal display (TFT-LCD).

(b) Description of the Related Art

Currently, most TFT-LCD manufacturing processes are automated to enhance productivity. Therefore, when processing substrates in a specific process apparatus used for this purpose, a cassette that stores the substrates to be processed is transferred to the process apparatus by an automated guided vehicle (AGV) and is then loaded into the process apparatus. The substrates in the cassette undergo various processes in the process apparatus.

Although the above processes are automated, when a problem occurs in the process apparatus, an operator must be able to check the status of the process apparatus. In this case, the substrates are transferred to the process apparatus in a cassette by a manually guided vehicle (MGV) that the operator manually operates.

Therefore, in the conventional substrate manufacturing process, the way of processing the substrates depends upon which transfer device (AGV or MGV) is used to transfer the cassette to the process apparatus. That is, when transferring the cassette to the process apparatus using the AGV (hereinafter referred to as an "AGV mode"), job processes on the substrates in each portion of the process apparatus including cassette loading are almost entirely performed automatically. On the other hand, when transferring the cassette to the product process apparatus using the MGV (hereinafter referred to as an "MGV mode"), job processes on the substrate in each process apparatus are manually or automatically performed according to the needs of the operator.

However, in the conventional substrate transfer systems, cassettes can be moved in and out of the process apparatus using only a transfer device that corresponds to the transfer mode set in the manufacturing process apparatus. Using a transfer device that does not correspond to the set transfer mode causes an error.

Therefore, in the conventional substrate transfer systems, the transfer mode set in the process apparatus is checked, and the cassette is then moved using the transfer device corresponding to this transfer mode. This is a cumbersome process resulting in a decrease in overall productivity.

SUMMARY OF THE INVENTION

It is an object of the present invention to provide an integrated repair system and its controlling method in which files, having information on defects and how to repair the defects, are merged as a batch at one time, and the merged files are referred to at a final manufacturing step after all inspections have been performed.

In order to achieve the object, the present invention provides a system for moving substrates in and out of a manufacturing process that has an automatic transfer device for automatically transferring a cassette that stores substrates, a manual transfer device for transferring the cassette according to instructions of an operator, and a process apparatus for performing predetermined jobs on the substrate stored in the cassette. The process apparatus has a port on which the cassette is temporarily placed by the automatic transfer device or the manual transfer device, a loader having a sensor that can receive a communication start signal from the automatic transfer device when the cassette is transferred by the automatic transfer device, and a job table on which actual jobs are performed on the substrates. When the cassette arrives at the process apparatus, the system checks if it is transferred by the AGV or by the MGV. If transferred by the AGV, the process apparatus automatically gets the cassette and processes the substrate. If transferred by the MGV, the system waits for the operator's instructions and processes the substrates according to the operator's instructions.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiment of the invention has been shown and described, simply by way of illustrating the best mode contemplated by the inventors of carrying out the invention. As will be realized, the invention is capable of modification in various obvious respects, all without departing from the spirit of the invention. Accordingly, the drawings and description are to be regarded as illustrative in nature, and not restrictive.

Figure 1:
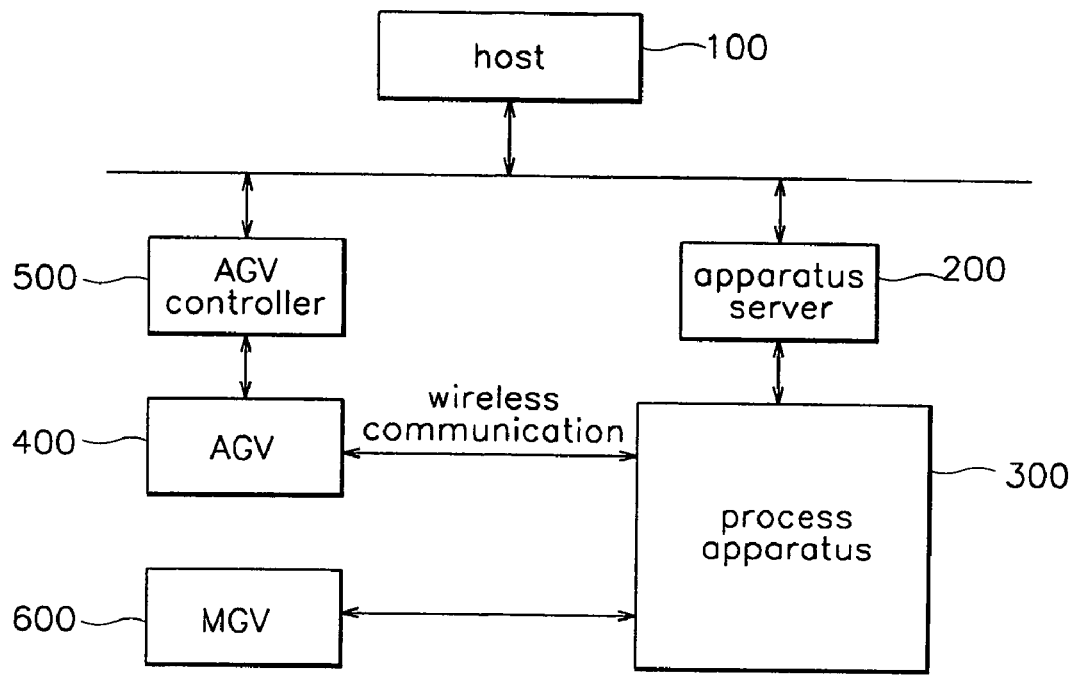
FIG. 1 is a block diagram of a transfer system according to a preferred embodiment of the present invention.

FIG. 1 is a diagram of a transfer system according to an embodiment of the present invention.

The transfer system comprises a host 100; an apparatus server 200; a process apparatus 300; an automated guided vehicle (AGV) 400; an AGV controller 500; and a manually guided vehicle (MGV) 600.

The host 100, coupled to the apparatus server 200 and the AGV controller 500 through a network using the transmission control protocol/Internet protocol (TCP/IP), transmits and receives predetermined messages so as to exchange information or to issue control commands. The AGV controller 500 receives commands from the host 100 and transmits specific commands to the AGV 400.

The apparatus server 200 is coupled to the process apparatus 300 using the semiconductor equipment communications standard (SECS), and interfaces the process apparatus 300 and the host 100.

The AGV 400 moves to the process apparatus 300 with a loaded cassette according to the commands of the AGV controller 500. When a job is completed in the process apparatus, it moves automatically with the cassette to another apparatus. After this step, the AGV 400 transmits a completion message to the AGV controller 500. Next, the AGV controller 500 transmits a corresponding message to the host 100 through the network so that the host 100 is able to manage the status of the AGV 400 and the entire transfer system.

The MGV 600 is used when the operator manually transfers cassettes. In the preferred embodiment of the present invention, it is possible to transfer cassettes to the appropriate process apparatus using either AGV 400 or MGV 600 as needed.

Figure 2:
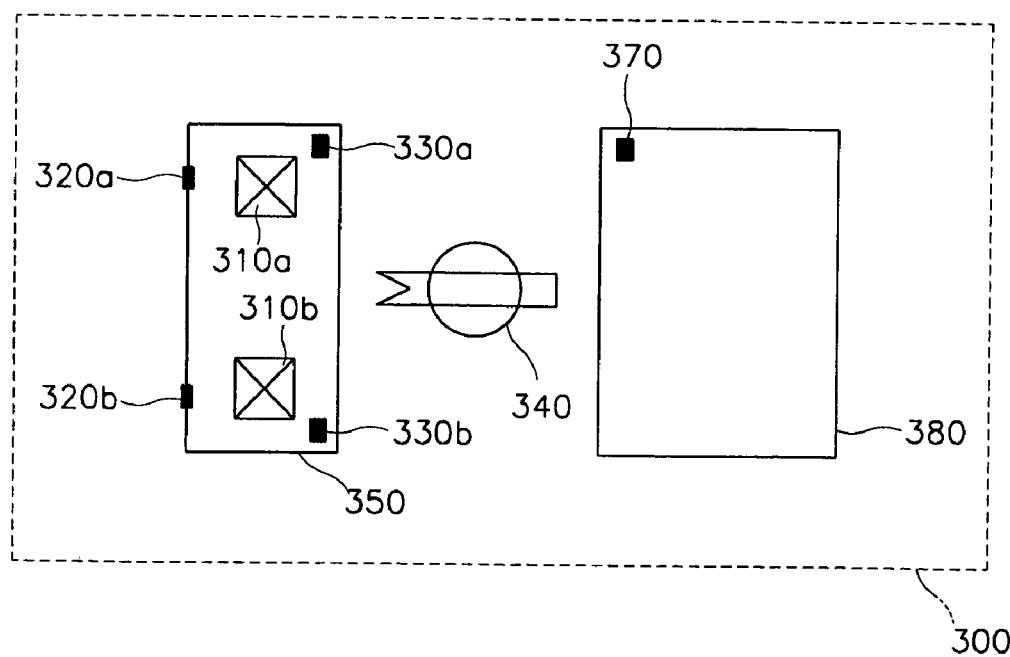
FIG. 2 is a detailed diagram of a process apparatus in FIG. 1.

FIG. 2 is a detailed diagram of the process apparatus 300 in FIG. 1.

As shown in FIG. 2, the process apparatus 300 comprises a loader 350 on which the cassette transferred by the AGV 400 or MGV 600 is temporarily loaded; a job table 380 on which various processes are performed on the glass substrates in the cassette; and a transfer robot 340 that transfers the glass substrates to the job table 380 from the cassette in the loader 350.

The loader 350 comprises ports 310a and 310b; sensors 320a and 320b used to perform wireless communications with the AGV 400; and bar code card readers (BCR) 330a and 330b which read IDs of the cassettes when the cassettes are loaded on the port 310a and the port 310b. A glass location detecting sensor (not shown), located on the port 310a and the port 310b, detects the position and the number of the glass substrates stored in the cassettes when the cassettes are on the port 310a and the port 310b. A verification code reader (VCR) 370, installed on the job table 380, reads IDs of the glass substrates.

Figure 3A:
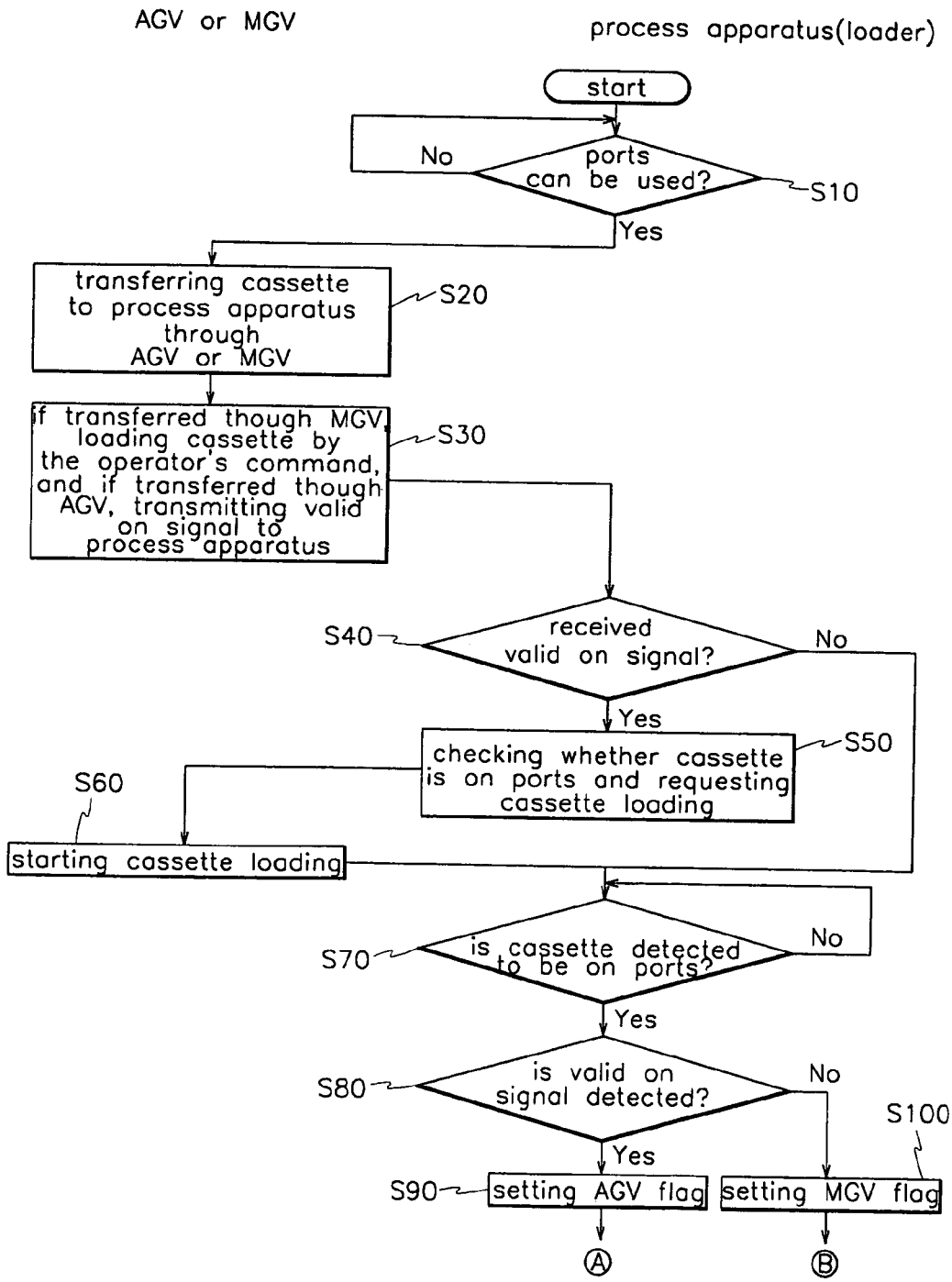
FIGS. 3(a) and (b) are flow charts of a transfer method according to a preferred embodiment of the present invention.
Figure 3B:
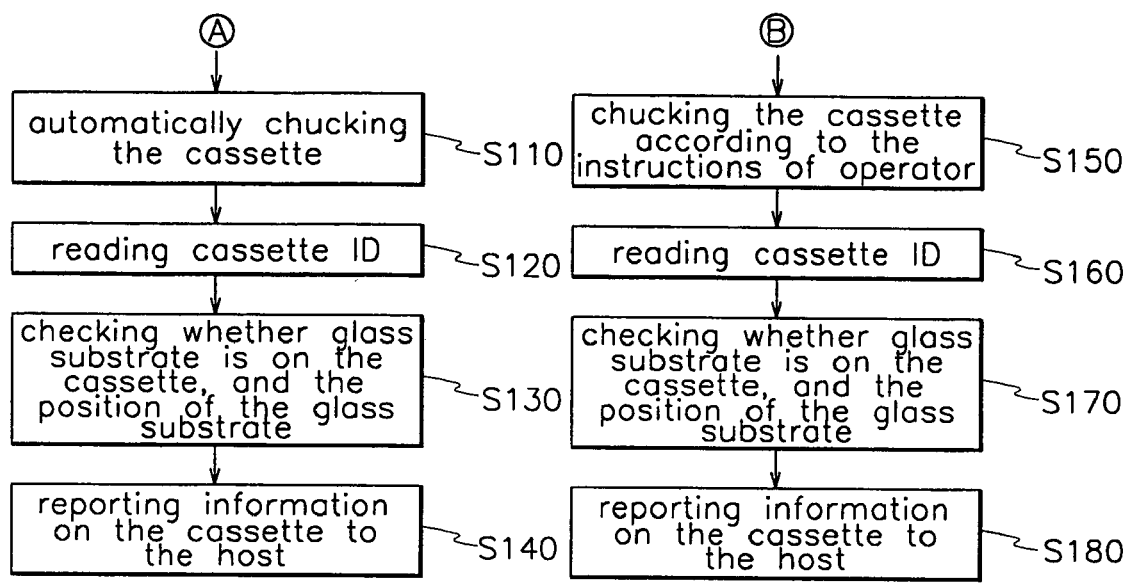

Transfer operations according to an embodiment of the present invention will now be described referring to FIGS. 3(a) and (b).

The loader 350 determines whether or not the ports 310a and 310b can be used (S10). If available, a cassette holding substrates is transferred to the process apparatus 300 through the AGV 400 or MGV 600 (S20).

In more detail, if the cassette is transferred to the process apparatus 300 by the AGV 400, the process apparatus 300 transmits to the apparatus server 200 a load request message to load the cassette, after checking the availability of a port. The apparatus server 200 then transmits this message to the host 100. When the host 100 receives the message, the host 100 searches its own database to find the cassette holding the glass substrate to be processed in the process apparatus 300. The host 100 then calls the AGV controller 500 to issue a transfer command directing the controller 500 to move the cassette to the process apparatus 300. The AGV controller 500 then controls the AGV 400 to load the corresponding cassette to a tester in a stocker or other process apparatus.

On the other hand, if the cassette is transferred to the process apparatus 300 through the MGV 600, an operator directly checks the ports 310a and 310b and then transfers the appropriate cassette to the process apparatus 300.

Next, if the cassette is transferred to the process apparatus 300 by the AGV 400, the AGV transmits to the process apparatus 300 a communication start signal (hereinafter referred to as a 'valid on signal') that prompts a loading process, and if the cassette is transferred to the process apparatus 300 by the MGV 600, the cassette is transferred to the process apparatus 300 by the operator's command (S30).

The process apparatus 300 determines whether it has received a valid on signal (S40). If received, the process apparatus 300 checks whether a cassette is on the ports 310a and 310b, and requests to load the cassette (S50). The AGV 400 then loads the cassette on the process apparatus 300 (S60), and the process apparatus 300 checks whether there is a cassette on the ports (S70).

In step S40, if the process apparatus 300 determines that it has not received the valid on signal, the process is skipped to the step S70 because the cassette may be on the ports of the process apparatus, when the cassette is transferred by the MGV, although the valid on signal is not received.

If a cassette is detected on the ports in the step S70, it is again determined whether the valid on signal is detected (S80).

If the valid on signal is detected in the step S80 (indicative of the cassette having been transferred by the AGV), the process apparatus then sets the transfer mode to the AGV mode (i.e., sets an AGV flag) (S90). On the other hand, if the valid on signal is not detected in the step S80 (indicative of the cassette having been transferred by the MGV), the process apparatus 300 then sets the transfer mode to the MGV mode (i.e., sets an MGV flag) (S100).

If the AGV flag is set in the step S90, the process apparatus 300 automatically chucks the cassette (S110), and then reads the cassette ID with the BCR on the loader 350 (S120). After checking whether there are glass substrates in the cassette and checking the position of the glass substrates via a sensor (not shown) on the ports 310a and 310b (S130), the process apparatus 300 reports information on the cassette to the host 100 (S140).

If the MGV flag is set in the step S100, the cassette is chucked by the instructions of an operator (S150). The reason for manually chucking the cassette is that the cassette is transferred by the MGV 600 only when problems occur in the process apparatus 300 and an operator's attention is necessary.

After manually chucking the cassette, the cassette IDs are read by the BCR on the loader (S160). This step is the same as the AGV mode. Next, it is determined whether glass substrates are in the cassette and the position of the glass substrates is checked (S170). Then, the information on the cassette is reported to the host 100 in step (S180).

In the steps S140 and S180, when the host 100 receives information on the cassette, the host 100 searches its own database referring to the cassette ID, and then transfers information on the glass substrates in the cassette, information on job contents and job processes, and job recipes to the process apparatus 300.

According to the preferred embodiment of the present invention, regardless of whether the cassette is transferred through the AGV mode or through the MGV mode, the cassette is placed on the ports of the process apparatus. When the cassette is placed on the ports, the process apparatus determines whether this cassette was transferred through the MGV mode or the AGV mode by detecting the valid on signal. Therefore, subsequent jobs are performed according to the corresponding transfer mode. This enhances productivity and efficiency.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A system for transferring a cassette storing a substrate, comprising:
    a first transfer device transferring the cassette automatically;
    a second transfer device transferring the cassette manually by an operator; and
    a process apparatus having a first mode performing a predetermined step on the substrate if the cassette is transferred by the first transfer device and a second mode performing a step instructed by the operator on the substrate if the cassette is transferred by the second transfer device, wherein the process apparatus determines whether the first mode is performed or the second mode is performed, upon receipt of the cassette from the transfer devices.

2. The system of claim 1, wherein the process apparatus comprises:

a port receiving the cassette from the first transfer device or the second transfer device;

a loader automatically loading the cassette from the port if the cassette is transferred by the first transfer device, wherein the cassette is loaded by the operator if the cassette is transferred by the second transfer device; and a step table where the substrate from the cassette is placed.

3. The system of claim 2, wherein the loader comprises a cassette ID reader reading a cassette ID when the cassette is placed on the port.

4. The system of claim 2, wherein the loader automatically chucks the cassette when the cassette is transferred by the first transfer device, and wherein the loader chucks the cassette according to the instructions of the operator when the cassette is transferred by the second transfer device.

5. The system of claim 4, wherein the port comprises a substrate detecting sensor to detect a number of the substrates stored in the cassette and positions of the substrates in the cassette.

6. The system of claim 4, wherein the process apparatus further comprises a transfer robot removing the substrates from the cassette on the port and transferring the substrates to the step table.

* * * * *